US012808652B2

(12) United States Patent
Hayashi

(10) Patent No.: US 12,808,652 B2
(45) **Date of Patent: *Nov. 24, 2026**

(54) LASER INTERFEROMETER USING A GAS CELL TO STABILIZE LASER WAVELENGTH

(71) Applicant: SEIKO EPSON CORPORATION, Tokyo (JP)

(72) Inventor: Nobuhito Hayashi, Chino (JP)

(73) Assignee: SEIKO EPSON CORPORATION (JP)

( * ) Notice: Subject to any disclaimer, the term of this patent is extended or adjusted under 35 U.S.C. 154(b) by 215 days.

This patent is subject to a terminal disclaimer.

(21) Appl. No.: 18/612,343

(22) Filed: Mar. 21, 2024

(65) Prior Publication Data

US 2024/0318951 A1 Sep. 26, 2024

(30) Foreign Application Priority Data

Mar. 22, 2023 (JP) ................................ 2023-045062

(51) Int. Cl.

| | |
|---|---|
| ***G01B 9/02002*** | (2022.01) |
| ***G01B 9/02*** | (2022.01) |
| ***H01S 5/024*** | (2006.01) |
| ***H01S 5/0687*** | (2006.01) |

(52) U.S. Cl.

CPC ..... *G01B 9/02002* (2013.01); *G01B 9/02045* (2013.01); *H01S 5/024* (2013.01); *H01S 5/0687* (2013.01); *G01B 2290/70* (2013.01)

(58) Field of Classification Search

CPC . G01B 9/02002; G01B 9/02045; H01S 5/024; H01S 5/0687

See application file for complete search history.

(56) References Cited

U.S. PATENT DOCUMENTS

| | | | |
|---|---|---|---|
| 4,998,017 A | 3/1991 | Ryan et al. | |
| 5,402,230 A * | 3/1995 | Tian | G01S 7/4917 356/482 |
| 5,461,234 A | 10/1995 | Miyazaki et al. | |
| 6,617,175 B1 | 9/2003 | Arno | |
| 7,129,519 B2 | 10/2006 | Arno | |
| 7,176,464 B2 | 2/2007 | Oka et al. | |
| 9,341,516 B2 | 5/2016 | Zhu et al. | |
| 10,066,992 B2 | 9/2018 | Ando et al. | |

(Continued)

FOREIGN PATENT DOCUMENTS

| | | |
|---|---|---|
| JP | 2007-285898 A | 11/2007 |
| JP | 2016-142527 A | 8/2016 |

(Continued)

*Primary Examiner* — Michael A Lyons

(74) *Attorney, Agent, or Firm* — Harness, Dickey & Pierce, P.L.C.

(57) ABSTRACT

A laser interferometer includes: an interference optical system including a laser source configured to emit laser beams and to cause the laser beams to interfere with each other; a gas cell configured to seal a gas absorbing light having a predetermined wavelength and allow the laser beams to be incident; an detector configured to detect an amount of light emitted from the gas cell and output an emitted light amount detection signal; and a light source controller configured to control a wavelength of the laser beams based on the emitted light amount detection signal.

10 Claims, 13 Drawing Sheets

(56) References Cited

U.S. PATENT DOCUMENTS

| | | | | |
|---|---|---|---|---|
| 10,209,057 | B2 * | 2/2019 | Edwards | G01D 5/266 |
| 10,794,819 | B2 | 10/2020 | Ashcom et al. | |
| 11,009,454 | B2 | 5/2021 | Wakuda | |
| 11,054,309 | B2 | 7/2021 | Suzuki et al. | |
| 11,073,424 | B2 | 7/2021 | Suzuki et al. | |
| 11,733,027 | B2 | 8/2023 | Yamada et al. | |
| 11,921,040 | B2 | 3/2024 | Mano | |
| 11,953,427 | B2 | 4/2024 | Feitisch et al. | |
| 12,111,255 | B2 | 10/2024 | Shibuya et al. | |
| 12,442,686 | B2 | 10/2025 | Yamada | |
| 2014/0160490 | A1 * | 6/2014 | Nishikawa | G01B 9/02007 356/511 |
| 2015/0019160 | A1 * | 1/2015 | Thurner | G01B 9/02004 356/498 |
| 2020/0124479 | A1 | 4/2020 | Suzuki et al. | |
| 2021/0072088 | A1 * | 3/2021 | Van Der Pasch | G01B 9/02007 |
| 2022/0065614 | A1 | 3/2022 | Yamada et al. | |
| 2024/0319087 | A1 * | 9/2024 | Hayashi | G01J 3/443 |

FOREIGN PATENT DOCUMENTS

| | | | |
|---|---|---|---|
| JP | 2022-038156 | A | 3/2022 |
| WO | 2019-009404 | A1 | 1/2019 |

* cited by examiner

LASER INTERFEROMETER USING A GAS CELL TO STABILIZE LASER WAVELENGTH

The present application is based on, and claims priority from JP Application Serial Number 2023-045062, filed Mar. 22, 2023, the disclosure of which is hereby incorporated by reference herein in its entirety.

BACKGROUND

1. Technical Field

The disclosure relates to a laser interferometer.

2. Related Art

JP-A-2007-285898 discloses a laser vibrometer as a device for measuring a vibration speed of an object. In this laser vibrometer, an object to be measured is irradiated with a laser beam, and the vibration speed is measured based on scattered laser beam subjected to a Doppler shift.

The laser vibrometer described in JP-A-2007-285898 includes a laser source unit that outputs a laser beam and a vibrator that generates a predetermined frequency. The vibrator shifts a frequency of an incident laser beam based on the vibration frequency thereof, and generates a reflected laser beam having a frequency different from that of the incident laser beam. In the laser vibrometer, the reflected laser beam is used as reference light. The scattered laser beam derived from the object to be measured and the reference light are combined and received by a photodetector, thereby electrically extracting a beat signal. Then, the vibration speed of the object to be measured is measured from the beat signal.

JP-A-2007-285898 is an example of the related art.

In the laser source, a wavelength of the output laser beam may change from an initial value due to various causes such as changes over time. In the laser vibrometer described in JP-A-2007-285898, when the wavelength of the laser beam changes from the initial value, a measured value of the vibration speed also changes. As a result, measurement accuracy of the laser vibrometer decreases as compared with an initial state.

SUMMARY

A laser interferometer according to an application example of the disclosure includes:

- an interference optical system including a laser source configured to emit laser beams and to cause the different types of the laser beams to interfere with each other;
- a gas cell configured to seal a gas absorbing light having a predetermined wavelength in and allow the laser beams to be incident;
- an detector configured to detect an amount of light emitted from the gas cell and output an emitted light amount detection signal; and a light source controller configured to control a wavelength of the laser beams based on the emitted light amount detection signal.

DESCRIPTION OF EMBODIMENTS

Hereinafter, a laser interferometer according to an embodiment of the disclosure will be described in detail with reference to the accompanying drawings.

Figure 1:
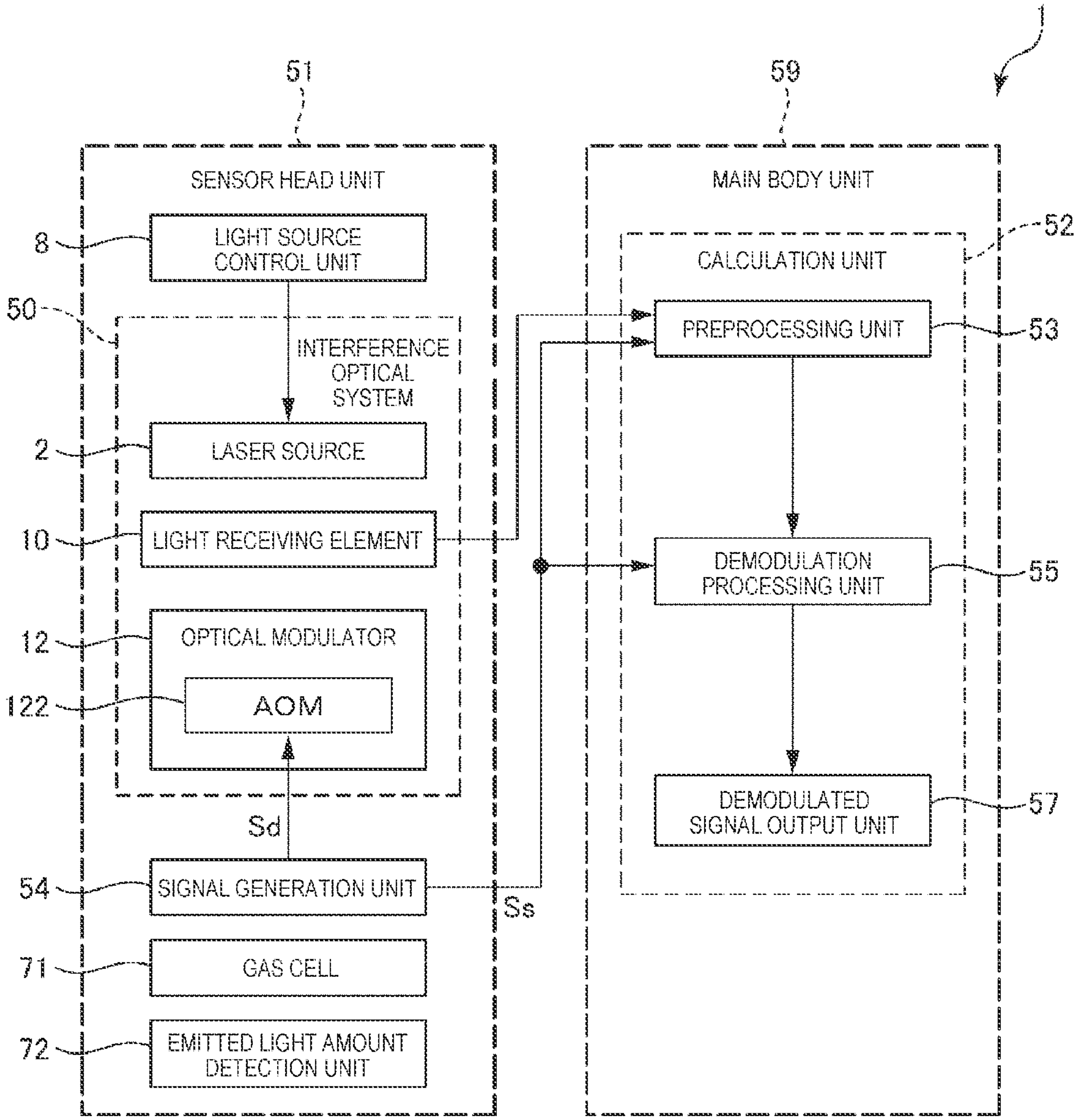
FIG. 1 is a functional block diagram showing a laser interferometer according to an embodiment.
Figure 2:
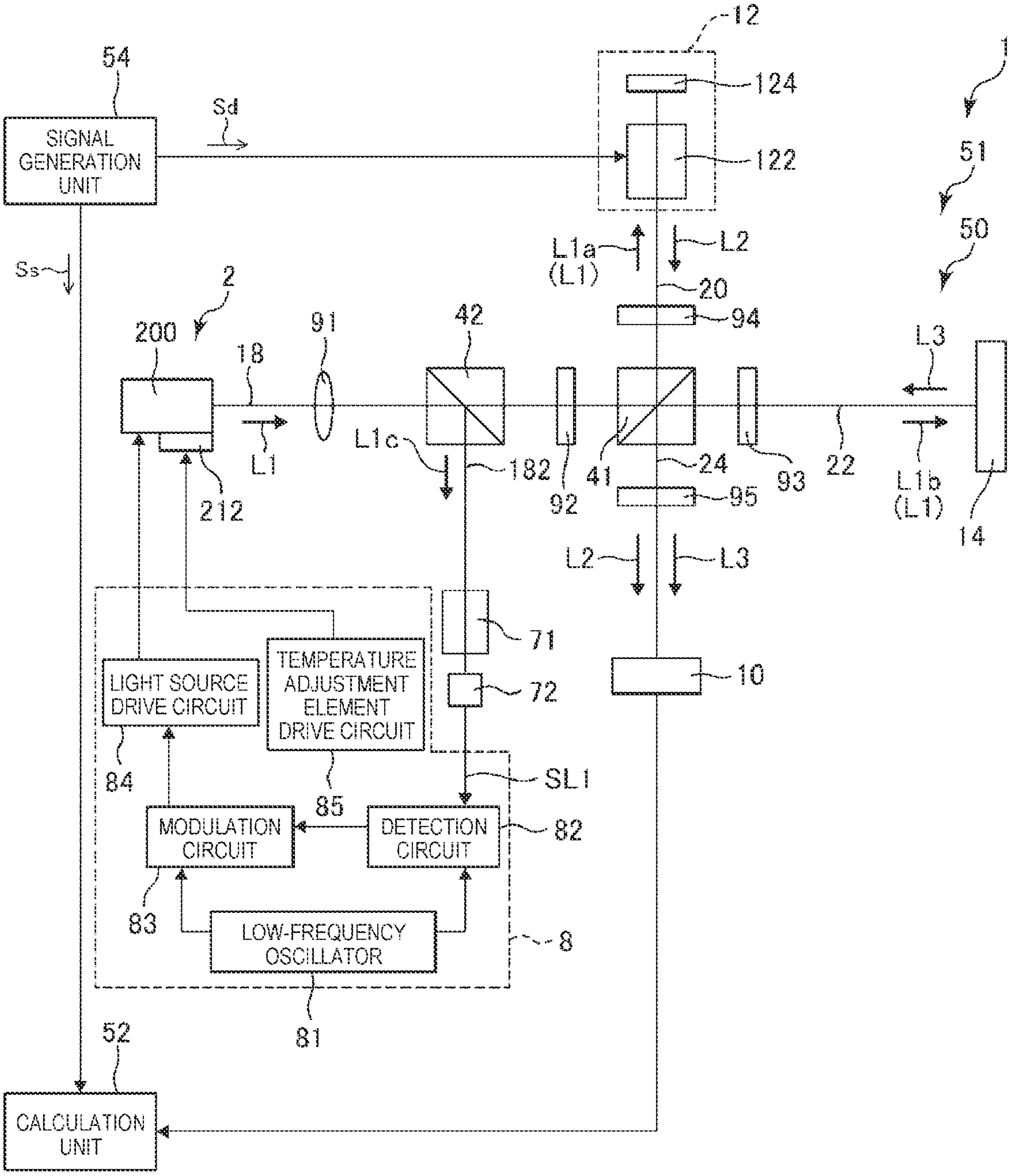
FIG. 2 is a schematic configuration diagram showing a sensor head unit provided in the laser interferometer of FIG. 1.

FIG. 1 is a functional block diagram showing a laser interferometer 1 according to an embodiment. FIG. 2 is a schematic configuration diagram showing a sensor head unit 51 provided in the laser interferometer 1 of FIG. 1.

The laser interferometer 1 shown in FIG. 1 measures, for example, a displacement or a speed of an object 14 shown in FIG. 2 by irradiating the object 14 with a laser beam and detecting a reflected laser beam.

The laser interferometer 1 shown in FIG. 1 includes the sensor head unit 51 and a main body unit 59.

The sensor head unit 51 shown in FIG. 1 includes an interference optical system 50, a signal generation unit 54, a gas cell 71, a detector 72, and a light source controller 8. A size and a weight of the sensor head unit 51 can be easily reduced, and the sensor head unit 51 can be easily provided with portability and ease of installation, and thus, for example, the sensor head unit 51 can be disposed near the object 14 shown in FIG. 2 which is a measurement target to be measured by the laser interferometer 1.

The main body unit 59 includes a calculation unit 52. The main body unit 59 can be disposed away from the sensor head unit 51, and may be accommodated in a rack or the like.

1. Sensor Head Unit

The sensor head unit 51 shown in FIG. 1 includes the interference optical system 50 and the signal generation unit 54.

1.1. Interference Optical System

The interference optical system 50 shown in FIG. 2 is a Michelson interference optical system. The interference optical system 50 includes a laser source 2, a collimation lens 91, light splitters 41 and 42, a half-wavelength plate 92, a quarter-wavelength plate 93, a quarter-wavelength plate 94, an analyzer 95, a light receiving element 10, an optical modulator 12, the gas cell 71, and the detector 72.

The laser source 2 emits emitted light L1 (laser beam). The light receiving element 10 converts the received light into an electric signal. The optical modulator 12 includes an acousto-optic modulator 122, changes a frequency of the emitted light L1, and generates reference light L2 including a modulation signal (a laser beam including a modulation signal). The emitted light L1 incident on the object 14 is reflected as object light L3 including a sample signal which is a Doppler signal derived from the object 14 (a laser beam including a sample signal).

An optical path coupling the light splitter 41 and the laser source 2 is referred to as an optical path 18. An optical path coupling the light splitter 41 and the optical modulator 12 is referred to as an optical path 20. An optical path coupling the light splitter 41 and the object 14 is referred to as an optical path 22. An optical path coupling the light splitter 41 and the light receiving element 10 is referred to as an optical path 24. An optical path coupling the light splitter 42 and the detector 72 is referred to as an optical path 182. The “optical path” in the present specification indicates a path which is set between optical components and along which light travels.

On the optical path 18, the half-wavelength plate 92, the light splitter 42, and the collimation lens 91 are disposed in this order from the light splitter 41. The quarter-wavelength plate 94 is disposed on the optical path 20. The quarter-wavelength plate 93 is disposed on the optical path 22. The analyzer 95 is disposed on the optical path 24. The gas cell 71 is disposed on the optical path 182.

The emitted light L1 emitted from the laser source 2 passes through the optical path 18, and is partially reflected and branched by the light splitter 42. Branched light L1*c* passes through the optical path 182 and transmits through the gas cell 71, and then is incident on the detector 72. The emitted light L1 transmitted through the light splitter 42 is split into two by the light splitter 41. First split light L1*a*, which is a part of the emitted light L1, passes through the optical path 20 and is incident on the optical modulator 12. Second split light L1*b*, which is another part of the emitted light L1, passes through the optical path 22 and is incident on the object 14. The reference light L2 generated by shifting the frequency by the optical modulator 12 passes through the optical path 20 and the optical path 24 and is incident on the light receiving element 10. The object light L3 generated by being reflected by the object 14 passes through the optical path 22 and the optical path 24 and is incident on the light receiving element 10.

In the interference optical system 50 as described above, phase information of the object light L3 is obtained by optical heterodyne interferometry. Specifically, two types of light having different frequencies (the reference light L2 and the object light L3) are caused to interfere with each other, and the phase information of the object light L3 is extracted from obtained interference light. Then, a displacement of the object 14 is obtained from the phase information in the calculation unit 52 to be described later. According to the optical heterodyne interferometry, the extraction of the phase information is less susceptible to an influence of disturbances, in particular, an influence of stray light having a frequency that becomes noise, and is given high robustness.

Hereinafter, each unit of the interference optical system 50 will be further described.

1.1.1. Laser Source

The laser source 2 is a laser source that emits the coherent emitted light L1. As the laser source 2, a light source having a line width of MHz band or less is preferably used. Specifically, examples thereof include gas lasers such as a He—Ne laser, and semiconductor laser elements such as a distributed feedback-laser diode (DFB-LD), a fiber Bragg grating-laser diode (FBG-LD), a vertical cavity surface emitting laser (VCSEL) and a Fabry-Perot laser diode (FP-LD).

The laser source 2 is particularly preferably a semiconductor laser element. Accordingly, a size of the laser source 2 can be particularly reduced. Therefore, a size of the laser interferometer 1 can be reduced. In particular, in the laser interferometer 1, the size and the weight of the sensor head unit 51 accommodating the interference optical system 50 is reduced, which is useful in that operability of the laser interferometer 1, such as a degree of freedom in disposing the sensor head unit 51, can be improved. In the following description, a case where the laser source 2 is a semiconductor laser element will be described as an example.

The laser source 2 shown in FIG. 2 is provided with a temperature adjuster 212. The temperature adjuster 212 is implemented by a Peltier element, a heater, or the like. Since the temperature adjuster 212 generates or absorbs heat, a temperature of a light emitter 200 of the laser source 2 can be adjusted. In the following description, the temperature of the light emitter 200 may be referred to as a “temperature of the laser source 2”.

1.1.2. Collimation Lens

The collimation lens 91 is an optical element disposed between the laser source 2 and the light splitter 41, and an example thereof is an aspherical lens. The collimation lens 91 collimates the emitted light L1 emitted from the laser source 2. The collimation lens 91 may be omitted when the emitted light L1 emitted from the laser source 2 is sufficiently collimated, for example, when a gas laser such as the He—Ne laser is used as the laser source 2.

On the other hand, it is preferable to provide the collimation lens 91 when the laser source 2 is a semiconductor laser element. Accordingly, since the emitted light L1 becomes collimated light, it is possible to prevent an increase in sizes of various optical components that receive the emitted light L1, and it is possible to reduce a size of the laser interferometer 1.

The emitted light L1, which becomes the collimated light, passes through the half-wavelength plate 92 to be converted into linearly polarized light having an intensity ratio of P-polarized light and S-polarized light of, for example, 50:50, and is incident on the light splitter 41.

1.1.3. Light Splitter

The light splitter 41 is a polarizing beam splitter disposed between the laser source 2 and the optical modulator 12 and between the laser source 2 and the object 14. The light splitter 41 transmits P-polarized light and reflects S-polarized light. With this function, the light splitter 41 splits the emitted light L1 into the first split light L1*a* which is light reflected by the light splitter 41 and the second split light L1*b* which is light transmitted through the light splitter 41.

The first split light L1*a*, which is the S-polarized light reflected by the light splitter 41, is converted into circularly polarized light by the quarter-wavelength plate 94, and is incident on the optical modulator 12. The first split light L1*a* incident on the optical modulator 12 is subjected to a frequency shift of $f_m$ [Hz] and is emitted as the reference light L2. Accordingly, the reference light L2 includes a modulation signal having the frequency $f_m$ [Hz]. The reference light L2 is converted into the P-polarized light when passing through the quarter-wavelength plate 94 again. The P-polarized light as the reference light L2 is transmitted through the light splitter 41 and the analyzer 95 and is incident on the light receiving element 10.

The second split light L1*b*, which is the P-polarized light transmitted through the light splitter 41, is converted into the circularly polarized light by the quarter-wavelength plate 93, and is incident on the object 14 in a moving state. The second split light L1*b* incident on the object 14 is subjected to a Doppler shift of $f_d$ [Hz] and is reflected as the object light L3. Accordingly, the object light L3 includes a sample signal having the frequency $f_d$ [Hz]. The object light L3 is converted into the S-polarized light when passing through the quarter-wavelength plate 93 again. The S-polarized light as the object light L3 is reflected by the light splitter 41 and is transmitted through the analyzer 95, and is incident on the light receiving element 10.

Since the emitted light L1 is coherent, the reference light L2 and the object light L3 are incident on the light receiving element 10 as the interference light. Therefore, in other words, the light splitter 41 has a function of splitting the emitted light L1 into one part (first split light L1*a*) and the other part (second split light L1*b*), a function of irradiating the optical modulator 12 with the first split light L1*a* and irradiating the object 14 with the second split light L1*b*, and a function of mixing the reference light L2 returning from the optical modulator 12 and the object light L3 returning from the object 14. Accordingly, since the laser beam can be split and mixed by the light splitter 41, a space of the interference optical system 50 can be saved, which can contribute to the reduction of the size of the laser interferometer 1.

A non-polarizing beam splitter may be used instead of the polarizing beam splitter. In this case, since the half-wavelength plate 92, the quarter-wavelength plate 93, the quarter-wavelength plate 94, and the like are unnecessary, the size of the laser interferometer 1 can be reduced by reducing the number of components. A light splitter other than the beam splitter may be used.

The light splitter 42 is a non-polarizing beam splitter disposed on the optical path 18. The light splitter 42 reflects a part of the emitted light L1 and branches the reflected light onto the optical path 182 to generate the branched light L1*c*. In addition, the light splitter 42 transmits the remaining part of the emitted light L1 and causes the remaining part of the emitted light L1 to be incident on the light splitter 41. A branching ratio is not particularly limited, but is preferably set such that an amount of the transmitted light is larger than that of the reflected light, specifically, a ratio of the reflected light is about 10% or less.

1.1.4. Analyzer

The S-polarized light and the P-polarized light that are orthogonal to each other are independent of each other, and an interference-induced beat does not appear by simply superimposing the S-polarized light and the P-polarized light. Here, a light wave obtained by superimposing the S-polarized light and the P-polarized light is passed through the analyzer 95 inclined by 45° with respect to both the S-polarized light and the P-polarized light. By using the analyzer 95, light having mutually common components can be transmitted and the interference can be caused. As a result, in the analyzer 95, the reference light L2 and the object light L3 interfere with each other, and the interference light having a frequency of $|f_m - f_d|$ [Hz] is generated.

1.1.5. Light Receiving Element

When the interference light is incident on the light receiving element 10, the light receiving element 10 outputs a photocurrent (light receiving signal) corresponding to an intensity of the interference light. By demodulating the sample signal from the light receiving signal using a method to be described later, the movement of the object 14, that is, a displacement and a speed can be finally obtained. Examples of the light receiving element 10 include a photodiode and a phototransistor. The light received by the light receiving element 10 is not limited to the interference light described above as long as the light includes the sample signal and the modulation signal. In addition, "demodulating the sample signal from the light receiving signal" in this specification includes demodulating the sample signal from various signals converted from the photocurrent (light receiving signal).

1.1.6. Optical Modulator

The optical modulator 12 shown in FIG. 2 includes the acousto-optic modulator (AOM) 122 and a mirror 124. The acousto-optic modulator 122 causes a periodic refractive index change in a medium due to a photoelastic effect, and shifts a frequency of transmitted light. The acousto-optic modulator 122 can be replaced with an electro-optic modulator (EOM). The mirror 124 reflects the transmitted light and causes the transmitted light to be incident on the acousto-optic modulator 122 again. This light is again subjected to a frequency shift by the acousto-optic modulator 122, and is emitted as the reference light L2 including the modulation signal. That is, the optical modulator 12 superimposes the modulation signal on the emitted light L1.

A drive signal Sd output from the signal generation unit 54 is input to the acousto-optic modulator 122. By appropriately setting the drive signal Sd, it is possible to control the modulation signal in the acousto-optic modulator 122.

1.2. Signal Generation Unit

The signal generation unit 54 shown in FIG. 1 outputs the drive signal Sd input to the optical modulator 12 and a reference signal Ss input to the calculation unit 52.

The signal generation unit 54 may be, for example, a signal generator such as a function generator or a signal generator, or a signal generator based on numerical control.

1.3. Gas Cell

The gas cell 71 seals a gas absorbing light having a predetermined wavelength. Examples of the sealed gas include gaseous alkali metals such as cesium and rubidium, halogens such as gaseous iodine, rare gases such as krypton, and also hydrogen cyanide and acetylene. These atoms or molecules absorb or emit light having a predetermined wavelength. The gas cell 71 may be provided with a temperature adjustment mechanism (not shown). Accordingly, a vapor pressure of the gas can be sufficiently increased even when a size of the gas cell 71 is further reduced. As a result, the size of the gas cell 71 can be reduced.

Table 1 below shows examples of combinations of gases (atoms or molecules) sealed in the gas cell 71 and wavelengths of light with which the gases are irradiated.

TABLE 1

| Wavelength | Atoms/molecules sealed in gas cell |
|---|---|
| 633 nm | Iodine |
| 780 nm | $^{85}$Rb (D2 line), $^{87}$Rb (D2 line) |
| 795 nm | $^{85}$Rb (D1 line), $^{87}$Rb (D1 line) |
| 852 nm | Cs (D2 line) |

TABLE 1-continued

| Wavelength | Atoms/molecules sealed in gas cell |
|---|---|
| 895 nm | Cs (D1 line) |
| 1550 nm | HCN, $C_2H_2$, Kr |

The branched light L1*c* branched by the light splitter 42 is incident on the gas cell 71. Then, the gas sealed in the gas cell 71 is irradiated with the branched light L1*c*. Accordingly, the atoms and molecules constituting the gas transition from a ground state to a state having higher energy (excited state) according to energy of the branched light L1*c*.

Figure 3:
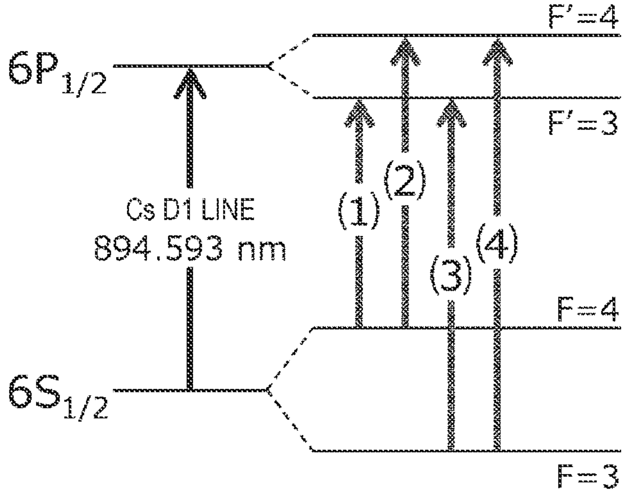
FIG. 3 is an energy level diagram showing an ultrafine structure in a ground state of cesium atoms.

FIG. 3 is an energy level diagram showing an ultrafine structure in a ground state of cesium atoms.

As shown in FIG. 3, it is known that the cesium atoms have an energy level represented by $6S_{1/2}$ as a ground level and an energy level represented by $6P_{1/2}$ as an excitation level. Each energy level of $6S_{1/2}$ and $6P_{1/2}$ has an ultrafine structure split into a plurality of energy levels. Specifically, $6S_{1/2}$ has two ground levels represented by F=3 and F=4. Further, $6P_{1/2}$ has two excitation levels represented by F'=3 and F'=4.

The cesium atoms at the ground level transition to the excitation level by absorbing a CsD1 line shown in FIG. 3.

For example, the cesium atoms at the ground level of F=4 transition to the excitation level of F'=3 by absorbing energy between levels indicated by an arrow (1) in FIG. 3. Further, the cesium atoms transition to the excitation level of F'=4 by absorbing energy between levels indicated by an arrow (2) in FIG. 3.

Further, the cesium atoms at the ground level of F=3 transition to the excitation level of F'=3 by absorbing energy between levels indicated by an arrow (3) in FIG. 3. Further, the cesium atoms transition to the excitation level of F'=4 by absorbing energy between levels indicated by an arrow (4) in FIG. 3.

Resonance wavelengths corresponding to the transitions of the arrows (1) to (4) in FIG. 3 are shown in Table 2 below.

TABLE 2

| Label | Transition | Resonance wavelength [nm] |
|---|---|---|
| (1) | $6S_{1/2}$ F = 4 → $6P_{1/2}$ F' = 3 | 894.6054 |
| (2) | $6S_{1/2}$ F = 4 → $6P_{1/2}$ F' = 4 | 894.6023 |
| (3) | $6S_{1/2}$ F = 3 → $6P_{1/2}$ F' = 3 | 894.5809 |
| (4) | $6S_{1/2}$ F = 3 → $6P_{1/2}$ F' = 4 | 894.5779 |

Figure 4:
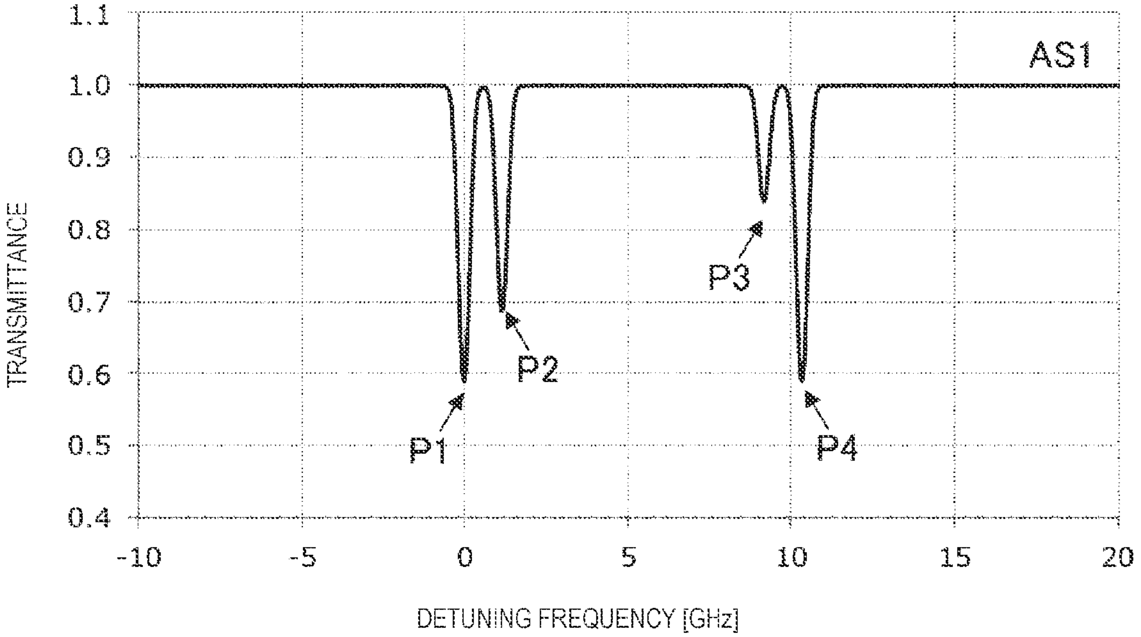
FIG. 4 is an absorption spectrum of a CsD1 line shown in FIG. 3.

FIG. 4 is an absorption spectrum AS1 of the CsD1 line shown in FIG. 3. Four absorption peaks P1 to P4 are observed in the absorption spectrum AS1 shown in FIG. 4. Frequencies of the absorption peaks P1 to P4 correspond to four transition frequencies represented by the arrows (1) to (4) in FIG. 3.

As described later, the light source controller 8 adjusts a current input to the laser source 2, specifically, a bias current. When the bias current is changed, an amount of the emitted light L1 emitted from the laser source 2 is changed and a center wavelength (center frequency) is changed accordingly. Therefore, when the branched light L1*c* is incident on the gas cell 71 and a change in an amount of light emitted from the gas cell 71 is observed, an absorption spectrum as shown in FIG. 5 is obtained.

Figure 5:
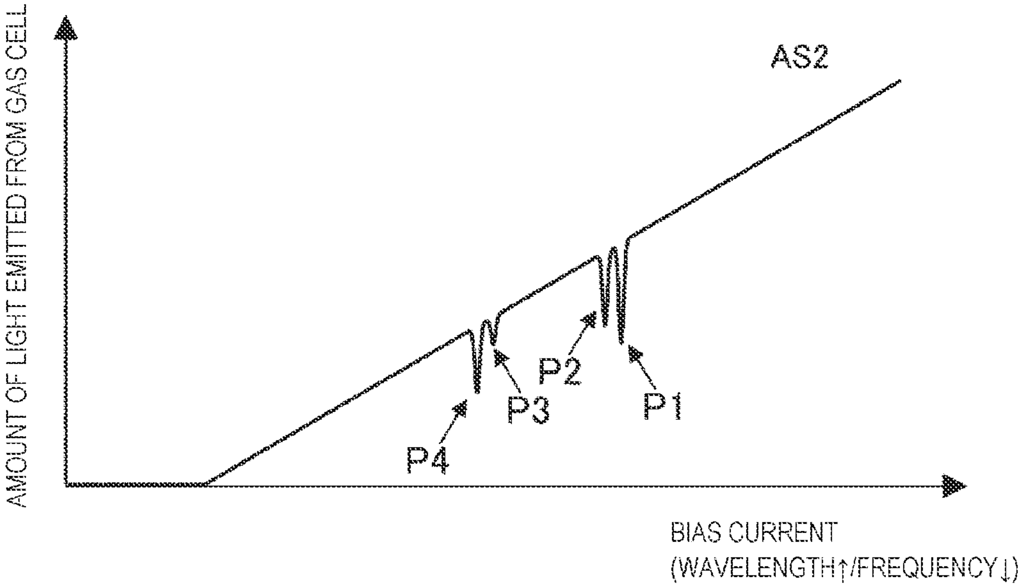
FIG. 5 is an absorption spectrum showing a relationship between a bias current input to a laser source and an amount of light emitted from a gas cell.

FIG. 5 is an absorption spectrum AS2 showing a relationship between the bias current input to the laser source 2 and the amount of the light emitted from the gas cell 71. In FIG. 5, a horizontal axis represents the bias current input to the laser source 2, and a vertical axis represents the amount of the light emitted from the gas cell 71. When the bias current increases, the center wavelength of the emitted light L1 emitted from the laser source 2 increases and the center frequency decreases, which is thus represented in FIG. 5 by directions of arrows attached to the horizontal axis.

As shown in FIG. 5, when the bias current increases, the amount of the light emitted from the gas cell 71 also increases. Therefore, the absorption spectrum AS2 shown in FIG. 5 is basically a monotonically increasing spectrum. On the other hand, in the laser source 2, the center wavelength of the emitted light L1 also changes according to the bias current. Therefore, when center wavelengths (center frequencies) of the branched light L1*c* coincide with the above-described four transition frequencies in a process of changing the bias current, each amount of the light emitted from the gas cell 71 takes a minimum value. Here, the light source controller 8 to be described later adjusts the bias current, so that the amount of the light emitted from the gas cell 71 has a minimum value corresponding to any one of the four absorption peaks P1 to P4. As a result, the center wavelength of the emitted light L1 emitted from the laser source 2 can be stabilized.

In FIG. 5, an absorption peak having a largest bias current is preferably selected. Accordingly, since a light output of the laser source 2 is maximized, an amount of the interference light incident on the light receiving element 10 of the interference optical system 50 can be maximized. As a result, an S/N ratio (signal-to-noise ratio) of the light receiving signal can be increased.

1.4. Detector

The detector 72 detects the amount of the light emitted from the gas cell 71. Then, an emitted light amount detection signal SL1 corresponding to the amount of the light is output. Examples of the detector 72 include a photodiode and a phototransistor.

1.5. Light Source Controller

The light source controller 8 controls the wavelength of the emitted light L1 (laser beam) emitted from the laser source 2 based on the emitted light amount detection signal SL1.

The light source controller 8 shown in FIG. 2 includes a low-frequency oscillator 81, a detection circuit 82, a modulation circuit 83, a light source drive circuit 84, and a temperature adjuster drive circuit 85.

The low-frequency oscillator 81 oscillates at a low frequency of, for example, about several Hz to several hundred Hz and outputs a low-frequency signal.

The emitted light amount detection signal SL1 is input to the detection circuit 82. Since modulation is applied to the bias current by the modulation circuit 83 to be described later, the emitted light amount detection signal SL1 includes a result of sweeping the bias current in a range determined by an amplitude of the low-frequency signal. That is, the wavelength (frequency) of the emitted light L1 oscillates in a predetermined range, and an oscillation of the change in the emitted light amount according to the oscillation is included. Therefore, in the detection circuit 82, a relationship between the bias current and the emitted light amount is obtained, and an absorption spectrum AS3 shown in FIG. 6 is obtained.

Figure 6:
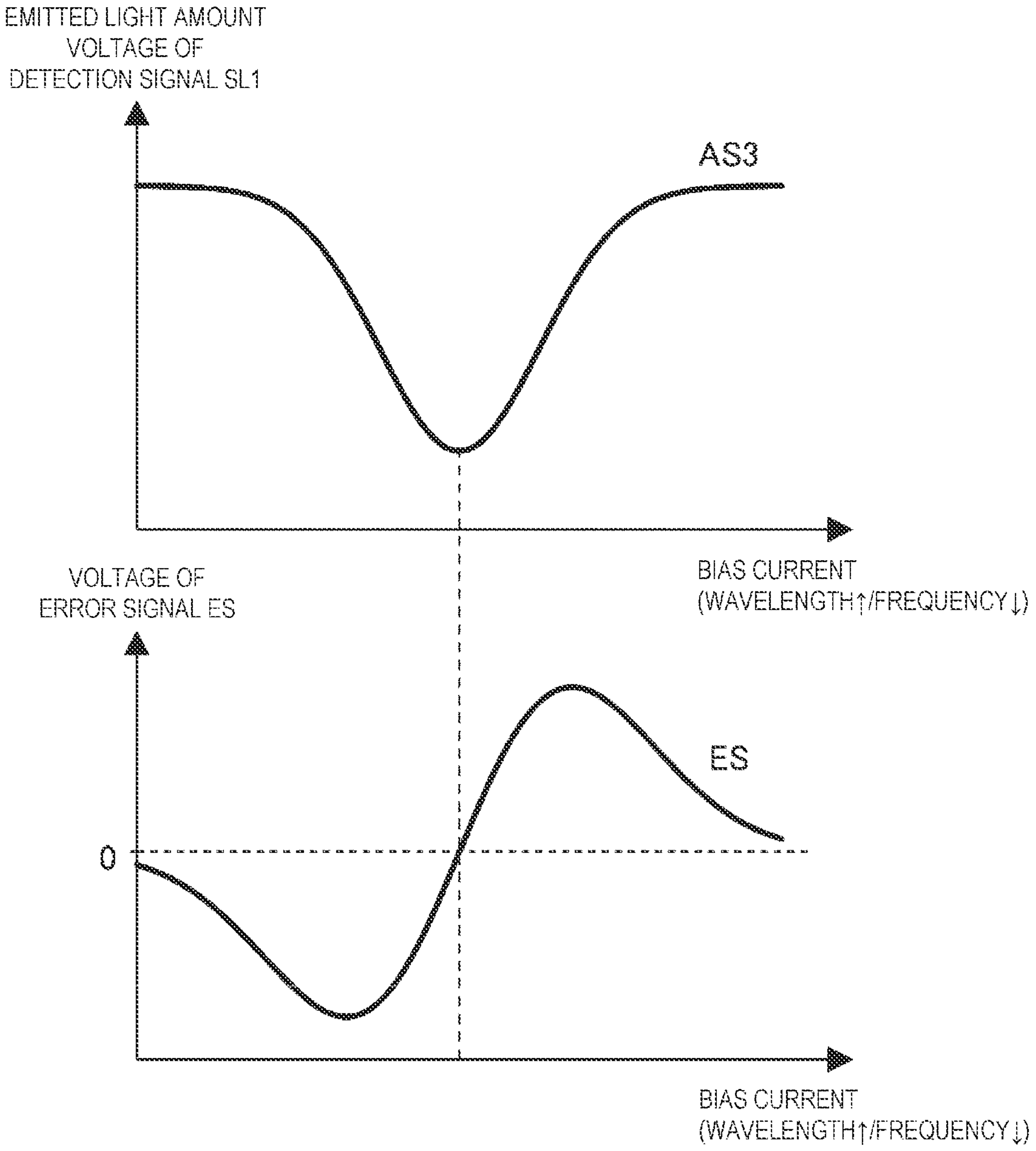
FIG. 6 is a diagram showing an absorption spectrum showing a relationship between the bias current input to the laser source and a voltage of an emitted light amount detection signal, and a waveform of an error signal which is a first derivative of the absorption spectrum.

FIG. 6 is a diagram showing the absorption spectrum AS3 showing a relationship between the bias current input to the laser source 2 and a voltage of the emitted light amount detection signal SL1, and a waveform of an error signal ES which is a first derivative of the absorption spectrum AS3.

A horizontal axis of the absorption spectrum AS3 in FIG. 6 represents the bias current input to the laser source 2, and a vertical axis represents the emitted light amount detection signal SL1 which is a voltage signal. The error signal ES in FIG. 6 is generated by differentiating the absorption spectrum AS3. A horizontal axis of the waveform of the error signal ES represents the bias current input to the laser source 2, and a vertical axis represents a voltage of the error signal ES.

As shown in FIG. 6, the error signal ES has a zero-cross point corresponding to an absorption peak of the absorption spectrum AS3, and the error signal changes monotonically before and after the zero-cross point. Therefore, in the light source drive circuit 84 shown in FIG. 2, the bias current can be adjusted based on the error signal ES corresponding to the absorption peak, so that the amount of the light emitted from the gas cell 71 takes a minimum value. Accordingly, the center wavelength (center frequency) of the emitted light L1 emitted from the laser source 2 is locked to any frequency of the absorption peaks P1 to P4 and is stabilized.

As described above, the detection circuit 82 synchronously detects the emitted light amount detection signal SL1 at the frequency of the low-frequency signal. Accordingly, the error signal ES shown in FIG. 6 is generated and output.

The modulation circuit 83 applies modulation to the error signal ES using the low-frequency signal. Then, the error signal ES to which the modulation is applied is output.

The light source drive circuit 84 adjusts the bias current input to the laser source 2 using the error signal ES applied with the modulation. For example, when the voltage of the error signal ES is positive, the bias current is decreased, and when the voltage of the error signal ES is negative, the bias current is increased. The light source drive circuit 84 sweeps the bias current with a predetermined width. According to the above operation, even if the amount of the light emitted from the gas cell 71 deviates from the minimum value, the deviation is fed back to the bias current and the amount of the light emitted from the gas cell 71 is adjusted to approach the minimum value. As a result, the center wavelength (center frequency) of the emitted light L1 is locked to any peak top of the absorption peaks P1 to P4 and is stabilized.

The absorption peaks P1 to P4 have a Doppler spread associated with movement of atoms and molecules sealed in the gas cell 71. For example, when the gas includes cesium atoms, the Doppler spread is about 380 MHz at 60 °C. In order to lock the center wavelength of the emitted light L1 to the peak top, it is preferable to make a frequency width of the modulation smaller than the Doppler spread. That is, a modulation width of the bias current is preferably set such that the frequency width of the modulation is less than the Doppler spread. In addition, in consideration of more stable operation, the frequency width of the modulation is preferably set to ½ of the Doppler spread or less, and more preferably set to ⅓ of the Doppler spread or less. On the other hand, a lower limit value is appropriately set so as to stabilize feedback control, and is set to, for example, 1/20 of the Doppler spread or more.

Figure 7:
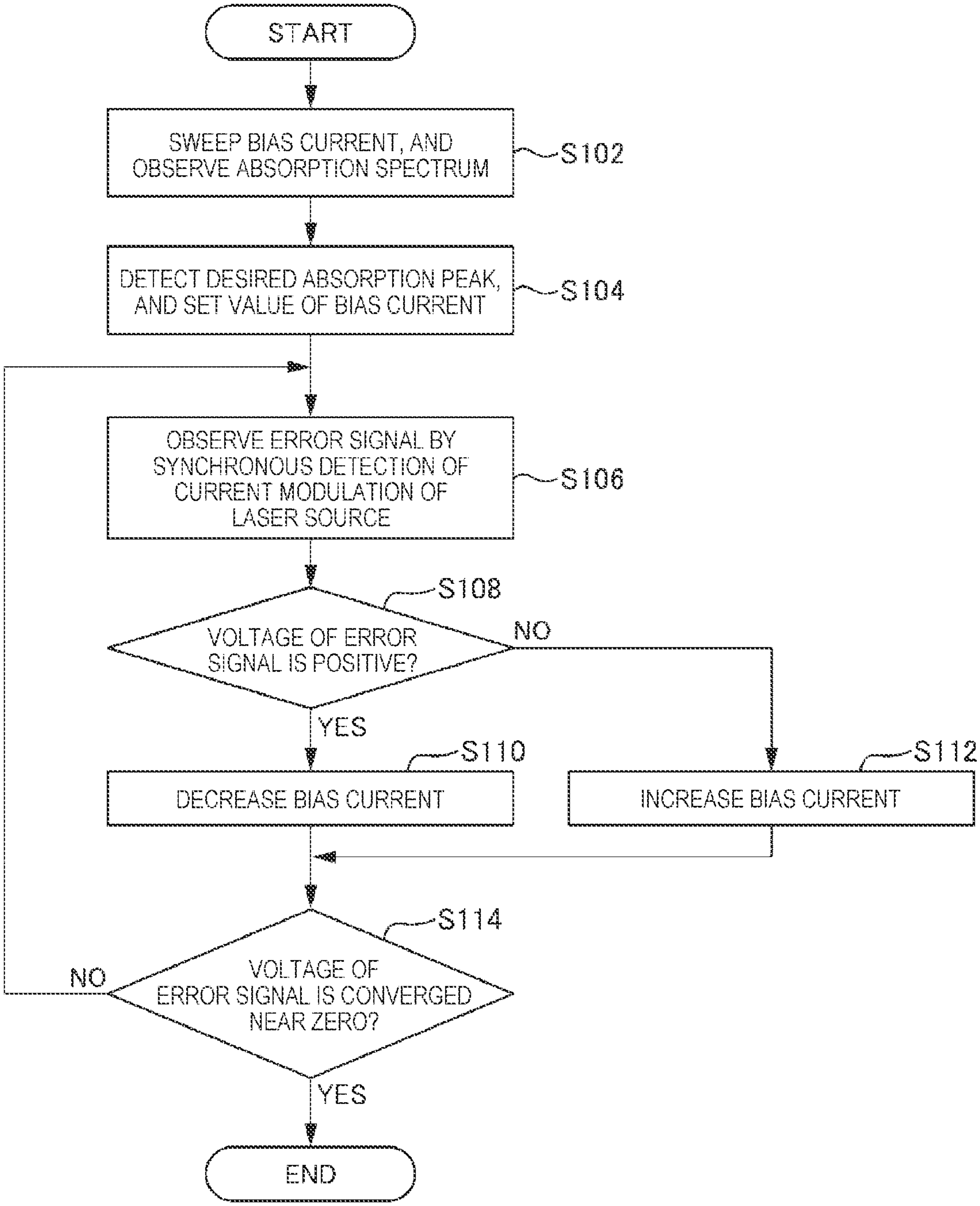
FIG. 7 is a flowchart showing feedback control of the bias current.

FIG. 7 is a flowchart showing the feedback control of the bias current described above.

In step S102 shown in FIG. 7, the bias current is swept, and the absorption spectrum AS3 is observed.

In step S104, a desired absorption peak is detected, and a value of the bias current is set.

In step S106, the error signal ES is observed by synchronous detection of current modulation of the laser source 2.

In step S108, it is determined whether the voltage of the error signal ES is positive. When the voltage is positive, the process proceeds to step S110. In step S110, the bias current is adjusted to decrease. On the other hand, when the voltage is negative, the process proceeds to step S112. In step S112, the bias current is adjusted to increase.

In step S114, it is determined whether the voltage of the error signal ES is converged near zero. When not converged, the process returns to step S106. When converged, the flow ends.

Then, the above flow is repeated as necessary. Accordingly, the center wavelength (center frequency) of the emitted light L1 can be stabilized. Such feedback control of the bias current is useful in that a response in stabilizing the center wavelength is relatively high.

The feedback control described above may be executed all the time, or may be executed as necessary. For example, when measurement is performed on the object 14, the feedback control may be stopped. Accordingly, the feedback control can be prevented from influencing measurement accuracy.

The temperature adjuster drive circuit 85 outputs a temperature adjustment signal to the temperature adjuster 212. Accordingly, heat generation or heat absorption of the temperature adjuster 212 is adjusted, and the temperature of the laser source 2 is controlled to a target temperature. The temperature adjuster drive circuit 85 shown in FIG. 2 fixes the temperature of the laser source 2 preferably to a constant value. Accordingly, an operation of the light source drive circuit 84 can be prevented from being hindered. In the embodiment, the temperature adjuster 212 and the temperature adjuster drive circuit 85 may be omitted.

2. Main Body Unit

The main body unit 59 shown in FIG. 1 includes the calculation unit 52. The calculation unit 52 includes a preprocessing unit 53, a demodulation processing unit 55, and a demodulated signal output unit 57. Functions exhibited by these functional units are implemented by hardware including, for example, a processor, a memory, an external interface, an input unit, and a display unit. Specifically, the functions are implemented by a processor reading and executing a program stored in a memory. These components can communicate with one another by an external bus.

Examples of the processor include a central processing unit (CPU) and a digital signal processor (DSP). Instead of a method in which the processor executes software, a method in which a field-programmable gate array (FPGA), an application specific integrated circuit (ASIC), or the like implements the above-described functions may be adopted.

Examples of the memory include a hard disk drive (HDD), a solid state drive (SSD), an electrically erasable programmable read-only memory (EEPROM), a read-only memory (ROM), and a random access memory (RAM).

Examples of the external interface include a digital input and output port such as a universal serial bus (USB) and an Ethernet (registered trademark) port.

Examples of the input unit include various input devices such as a keyboard, a mouse, a touch panel, and a touch pad. Examples of the display unit include a liquid crystal display panel and an organic electro luminescence (EL) display panel.

The input unit and the display unit may be provided as necessary, and may be omitted.

A function of the light source controller 8 described above is also implemented by the same hardware as described above.

For example, a preprocessing unit and a demodulation unit disclosed in JP-A-2022-38156 may be applied to the preprocessing unit 53 and the demodulation processing unit 55.

The preprocessing unit 53 performs preprocessing on the light receiving signal based on the reference signal Ss. In the preprocessing, the light receiving signal is divided into two signals PASS1 and PASS2, one of which is then multiplied by the reference signal, and then the two signals PASS1 and PASS2 are added to output a preprocessed signal.

The demodulation processing unit 55 demodulates the sample signal corresponding to a speed and a position of the object 14 based on the reference signal Ss from the preprocessed signal output from the preprocessing unit 53.

The demodulated signal output unit 57 performs phase connection by performing, for example, phase unwrapping processing on the demodulated signal output from the demodulation processing unit 55. Accordingly, the position of the object 14 is calculated. Therefore, the laser interferometer 1 is a displacement meter. Further, the speed can be obtained from the position of the object 14. Therefore, the laser interferometer 1 is a speedometer.

When the displacement of the object 14 is measured by the laser interferometer 1, a measured displacement d is expressed by the following Equation (A).

$$d = \frac{\lambda}{4\pi n}\phi \quad \text{(A)}$$

In Equation (A), λ is the wavelength of the emitted light L1, n is a refractive index of an atmosphere, and φ is a phase of the sample signal demodulated by the demodulation processing unit 55.

As can be seen from the above Equation (A), the measured displacement d is influenced by the wavelength λ of the emitted light L1. For example, consider a situation where the initial wavelength λ becomes λ' due to changes over time or the like. When the measured displacement in this case is d', the measured displacement d' is expressed by the following Equation (A').

$$d' = \frac{\lambda'}{4\pi n}\phi \quad \text{(A')}$$

Here, a change rate when the initial measured displacement d changes to the measured displacement d' is denoted by Δd/d. The change rate Δd/d of the measured displacement is expressed by the following Equation (B).

$$\frac{\Delta d}{d} = \frac{d' - d}{d} = \frac{\lambda' - \lambda}{\lambda} = \frac{\Delta\lambda}{\lambda} \quad \text{(B)}$$

Accordingly, it is understood that the change rate Δλ/λ of the wavelength influences the change rate Δd/d of the measured displacement. Accordingly, if the wavelength of the emitted light L1 can be stabilized, accuracy of the measured displacement can be improved.

3. First Modification

Next, a first modification of the laser interferometer 1 will be described.

Figure 8:
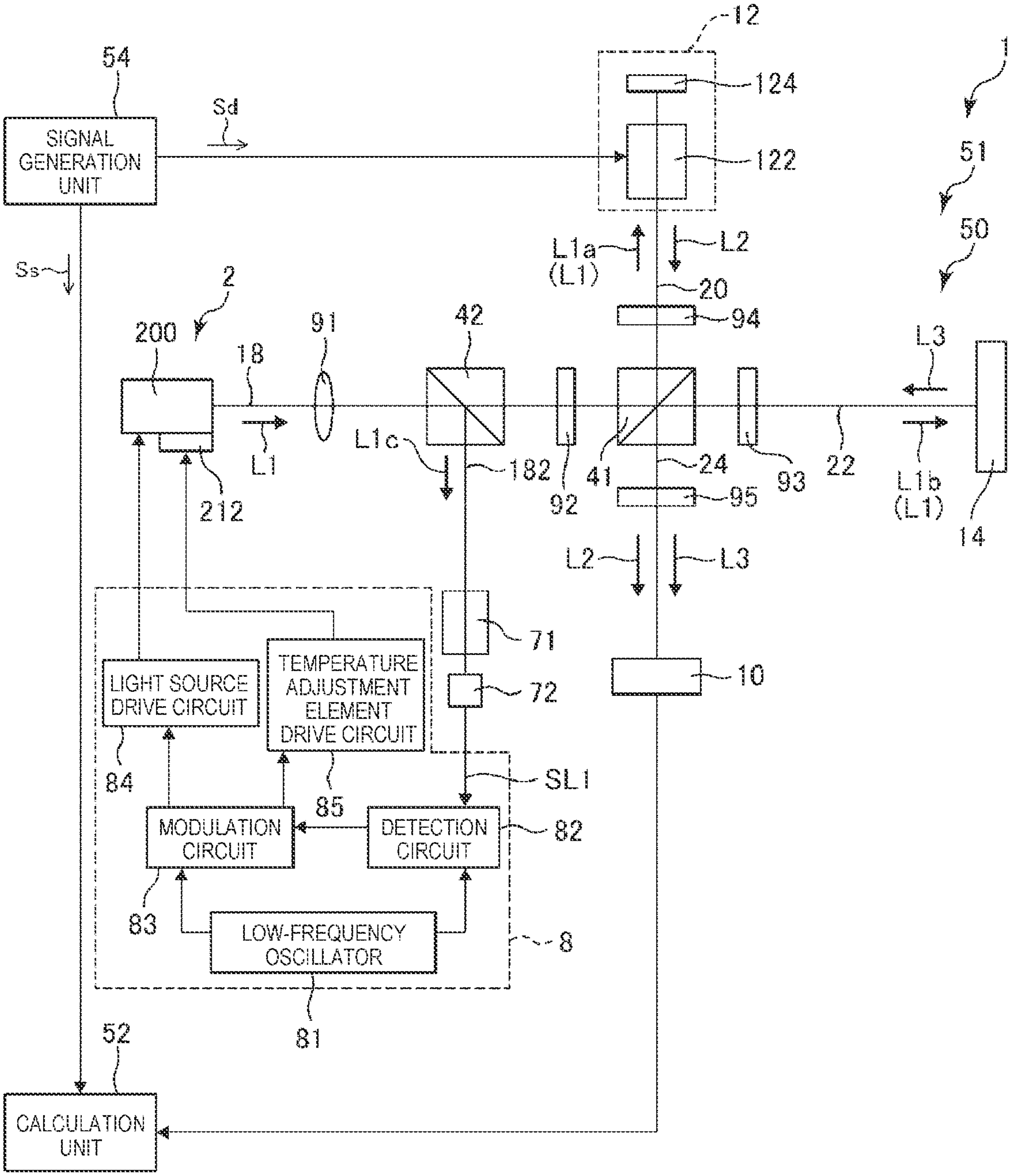
FIG. 8 is a schematic configuration diagram showing a laser interferometer according to a first modification.

FIG. 8 is a schematic configuration diagram showing the laser interferometer 1 according to the first modification.

Hereinafter, the first modification will be described. In the following description, differences from the above embodiment will be mainly described, and the description of similar matters will be omitted. In FIG. 8, the same reference numerals are given to matters the same as those in the above embodiment.

The first modification is the same as the above embodiment except that the light source controller 8 adjusts the temperature of the laser source 2 instead of adjusting the bias current.

In the light source controller 8 shown in FIG. 8, the signal output from the modulation circuit 83, that is, the error signal to which the modulation is applied is input to the temperature adjuster drive circuit 85. On the other hand, the light source drive circuit 84 shown in FIG. 8 fixes the bias current preferably to a constant value. Accordingly, an operation of the temperature adjuster drive circuit 85 can be prevented from being hindered.

The temperature adjuster drive circuit 85 shown in FIG. 8 adjusts the temperature adjustment signal input to the temperature adjuster 212 using the error signal to which the modulation is applied. For example, when the voltage of the error signal is positive, the temperature of the laser source 2 is decreased by causing the temperature adjuster 212 to absorb heat, and when the voltage of the error signal is negative, the temperature of the laser source 2 is increased by causing the temperature adjuster 212 to generate heat.

Figure 9:
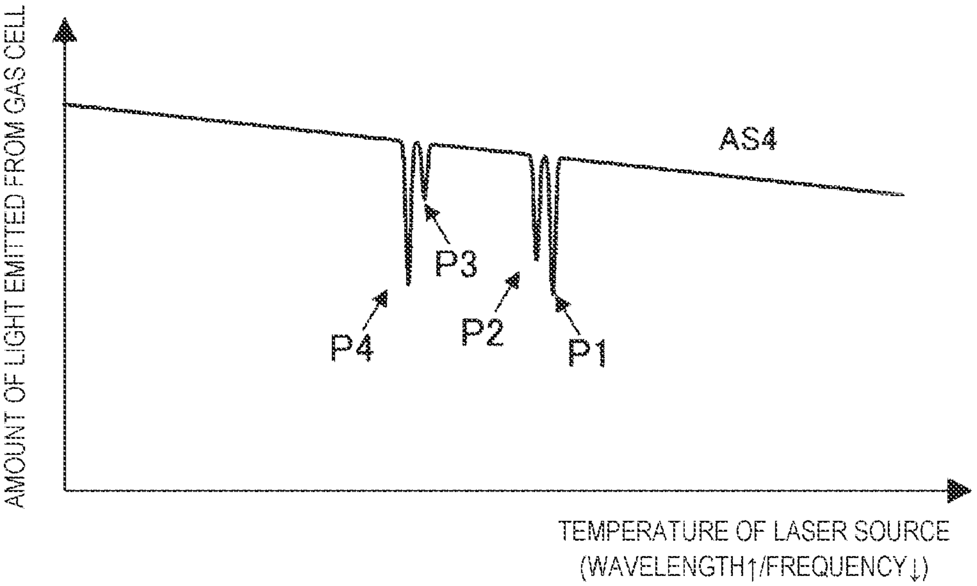
FIG. 9 is an absorption spectrum showing a relationship between a temperature of the laser source and the amount of light emitted from the gas cell.

FIG. 9 is an absorption spectrum AS4 showing a relationship between a temperature of the laser source 2 and the amount of light emitted from the gas cell 71. In FIG. 9, a horizontal axis represents the temperature of the laser source 2, and a vertical axis represents the amount of the light emitted from the gas cell 71. When the temperature of the laser source 2 increases, the center wavelength of the emitted light L1 emitted from the laser source 2 increases and the center frequency decreases, which is thus represented in FIG. 9 by directions of arrows attached to the horizontal axis.

As shown in FIG. 9, when the temperature of the laser source 2 is increased, the amount of the light emitted from the gas cell 71 decreases. Therefore, the absorption spectrum AS4 shown in FIG. 9 is basically a monotonically decreasing spectrum. On the other hand, in the laser source 2, the center wavelength of the emitted light L1 also changes according to the temperature. Therefore, when center wavelengths (center frequencies) of the branched light L1*c* coincide with the above-described four transition frequencies in a process of changing the temperature, each amount of the light emitted from the gas cell 71 takes a minimum value. Here, the light source controller 8 shown in FIG. 8 adjusts the temperature of the laser source 2, so that the amount of the light emitted from the gas cell 71 has a minimum value corresponding to any one of the four absorption peaks. As a result, the center wavelength of the emitted light L1 emitted from the laser source 2 can be stabilized.

According to the above operation, even if the amount of the light emitted from the gas cell 71 deviates from the minimum value, the deviation is fed back to the temperature of the laser source 2 and the amount of the light emitted from the gas cell 71 is adjusted to approach the minimum value. As a result, the center wavelength (center frequency) of the emitted light L1 is locked to any peak top of the absorption peaks P1 to P4 and is stabilized.

Figure 10:
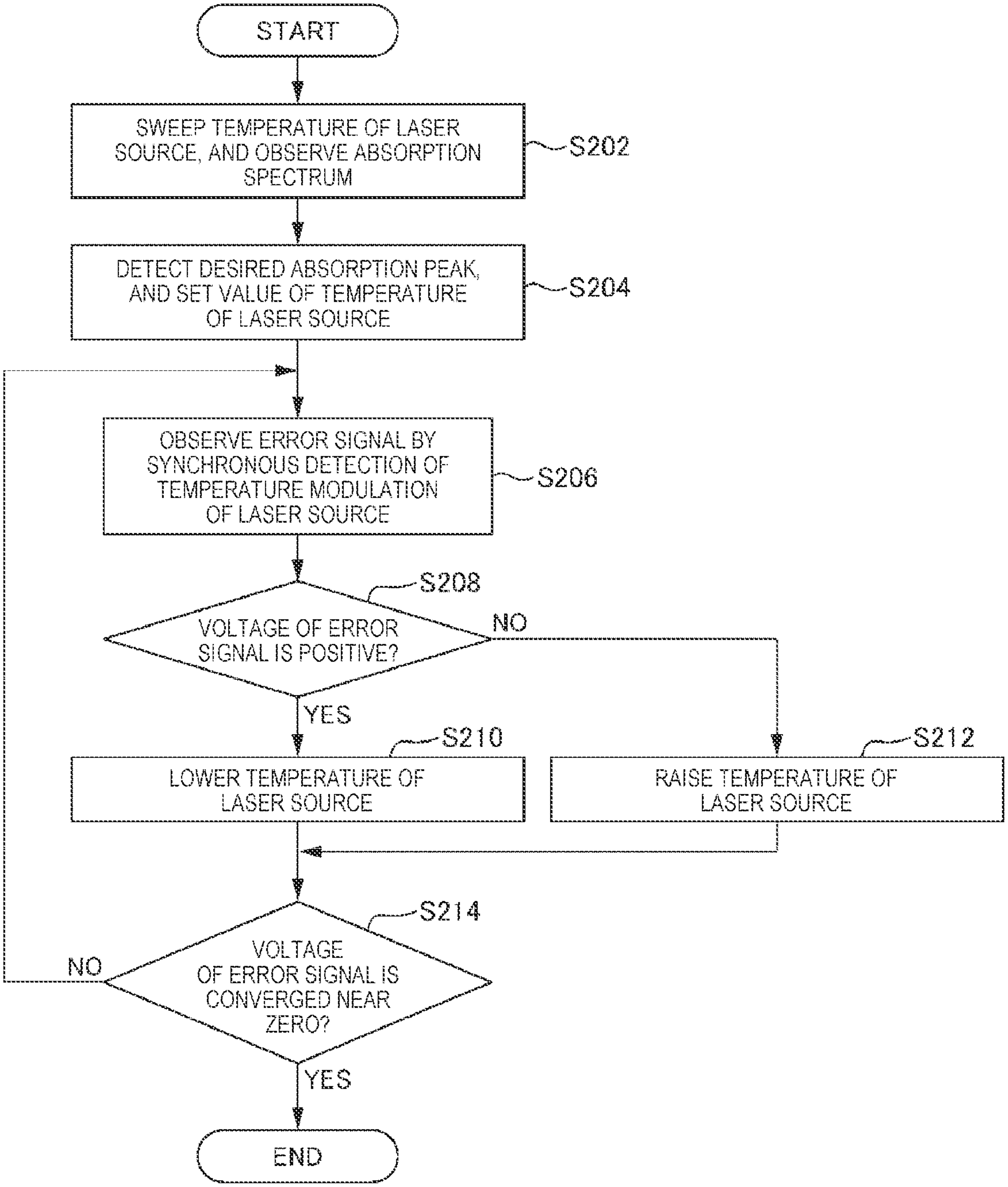
FIG. 10 is a flowchart showing feedback control of the temperature of the laser source.

FIG. 10 is a flowchart showing the feedback control of the temperature of the laser source 2 described above.

In step S202 shown in FIG. 10, the temperature of the laser source 2 is swept, and the absorption spectrum is observed.

In step S204, a desired absorption peak is detected, and a value of the temperature of the laser source 2 is set.

In step S206, the error signal is observed by synchronous detection of temperature modulation of the laser source 2.

In step S208, it is determined whether the voltage of the error signal is positive. When the voltage is positive, the process proceeds to step S210. In step S210, the temperature of the laser source 2 is adjusted to decrease. On the other hand, when the voltage is negative, the process proceeds to step S212. In step S212, the temperature of the laser source 2 is adjusted to increase.

In step S214, it is determined whether the voltage of the error signal is converged near zero. When not converged, the process returns to step S206. When converged, the flow ends.

Then, the above flow is repeated as necessary. Accordingly, the center wavelength (center frequency) of the emitted light L1 can be stabilized.

In the first modification described above, effects same as those of the above embodiment can also be obtained.

In the first modification, an amount of change in the amount of the light when the wavelength of the emitted light L1 is adjusted by a predetermined amount can be reduced as compared with the above embodiment. Accordingly, it is possible to prevent a change in the amount of the interference light incident on the light receiving element 10 of the interference optical system 50 as compared with the above embodiment. As a result, it is possible to prevent variation over time of the S/N ratio (signal-to-noise ratio) of the light receiving signal.

For example, a case where a general surface emitting laser element is used as the laser source 2 and the center wavelength of the emitted light L1 is adjusted to be longer by 0.1 nm is considered as an example. Table 3 below shows a change width of the current or the temperature and a change width of the light amount associated with adjustment when the adjustment of increasing the center wavelength of the emitted light L1 by 0.1 nm is performed under the current wavelength control (the above embodiment) and the temperature wavelength control (the first modification) in this example.

TABLE 3

| Control method | Change parameter | Numerical value | Unit |
|---|---|---|---|
| Current wavelength control | Current change | +0.38 | mA |
| | Light amount change | +11.5 | % |
| Temperature wavelength control | Temperature change | +1.7 | °C |
| | Light amount change | −0.7 | % |

In the above embodiment, it is necessary to increase the bias current by 0.38 mA, and accordingly, the amount of the emitted light L1 increases by 11.5%. Meanwhile, in the first modification, it is necessary to increase the temperature of the laser source 2 by 1.7 °C, and accordingly, the amount of the emitted light L1 decreases by 0.7%. As described above, the amount of change in the amount of the light in the first modification is reduced to 1/10 of that in the above embodiment or less.

The above calculation examples were calculated using various parameters of the surface emitting laser element shown in Table 4 below.

TABLE 4

| Parameter | Numerical value | Unit |
|---|---|---|
| Current-wavelength coefficient | 0.26 | nm/mA |
| Current-light output coefficient | 0.6 | W/A |
| (Slope efficiency) | (When outputting 2 mW) 30 | %/mA |
| Temperature-wavelength coefficient | 0.06 | nm/°C |
| Temperature-light output coefficient | −0.4 | %/°C |

4. Second Modification

Next, a second modification of the laser interferometer 1 will be described.

Figure 11:
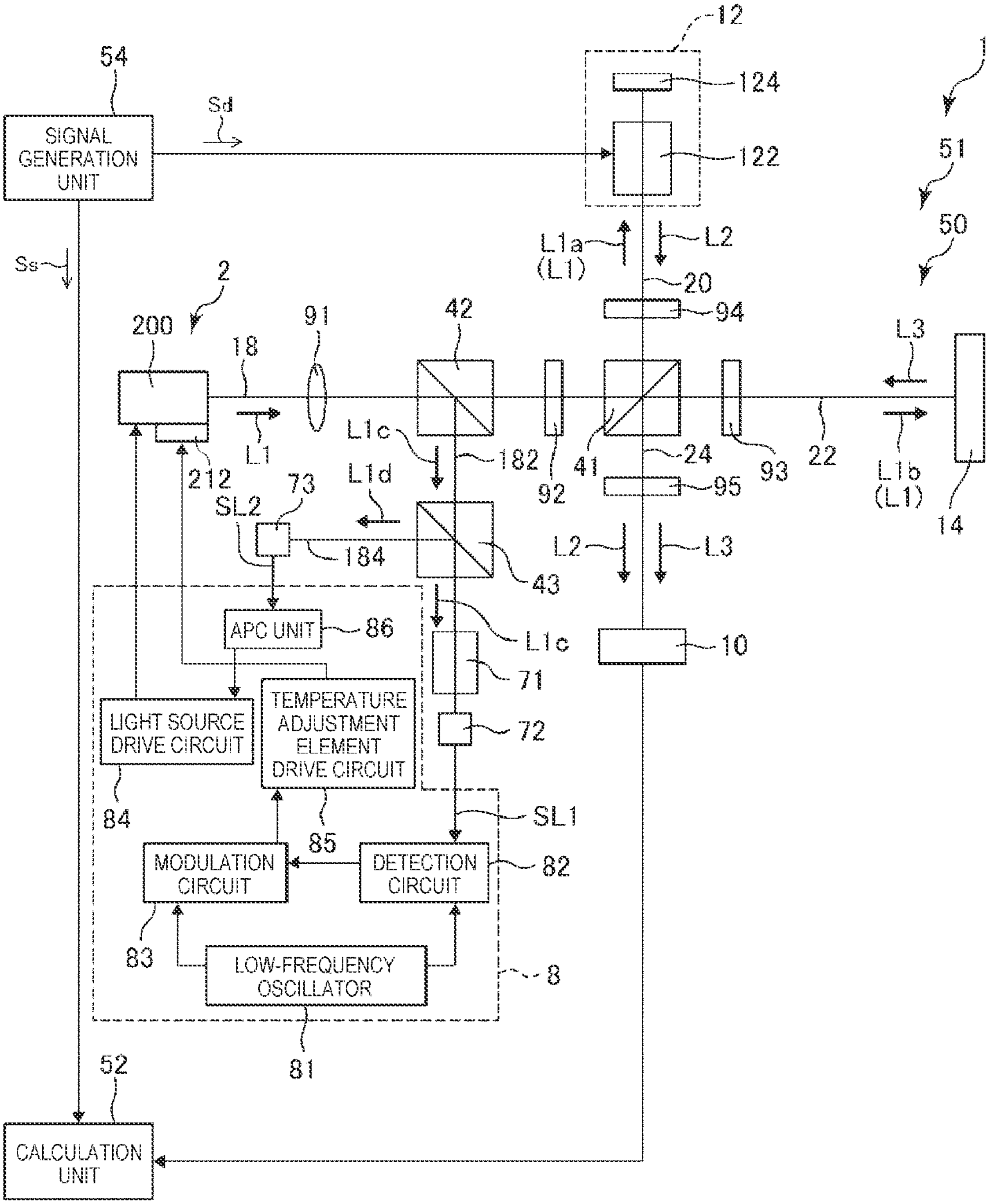
FIG. 11 is a schematic configuration diagram showing a laser interferometer according to a second modification.

FIG. 11 is a schematic configuration diagram showing the laser interferometer 1 according to the second modification.

Hereinafter, the second modification will be described. In the following description, differences from the above embodiment and the modification will be mainly described, and the description of similar matters will be omitted. In FIG. 11, the same reference numerals are given to matters the same as those in the first modification.

The second modification is the same as the first modification except that the light source controller 8 adjusts the bias current based on the light output of the laser source 2 in addition to adjusting the temperature of the laser source 2.

The interference optical system 50 shown in FIG. 11 further includes a light splitter 43, a light output detector 73, and an APC unit 86.

The light splitter 43 is a non-polarizing beam splitter disposed on the optical path 182 branched by the light splitter 42. The light splitter 43 reflects a part of the branched light L1*c* and branches the reflected light onto an optical path 184 to generate branched light Lid. In addition, the light splitter 43 transmits the remaining part of the branched light L1*c* and causes the remaining part of the branched light L1*c* to be incident the gas cell 71. A branching ratio is not particularly limited. The arrangement of the light splitter 43 is not limited to the above.

The light output detector 73 detects an amount of the branched light Lid branched onto the optical path 184 by the light splitter 43. In this specification, the amount of the light is referred to as a "light output". The light output is substantially proportional to the amount of the emitted light L1 emitted from the laser source 2, and is used to monitor the amount of the emitted light L1. The light output detector 73 outputs a light output detection signal SL2 corresponding to the amount of the branched light Lid. Examples of the light output detector 73 include a photodiode and a phototransistor.

The APC unit 86 outputs a light output control signal for controlling the bias current based on the light output detection signal SL2, so that the light output of the laser source 2 becomes constant. The light source drive circuit 84 shown in FIG. 11 adjusts the bias current based on the light output control signal. APC refers to auto power control.

As described above, in the second modification, a configuration of feedback control of the bias current using the APC unit 86 is added to the configuration (feedback control of the temperature) of the first modification. Accordingly, the center wavelength (center frequency) of the emitted light L1 emitted from the laser source 2 can be stabilized, and the light output can be controlled to be constant.

Figure 12:
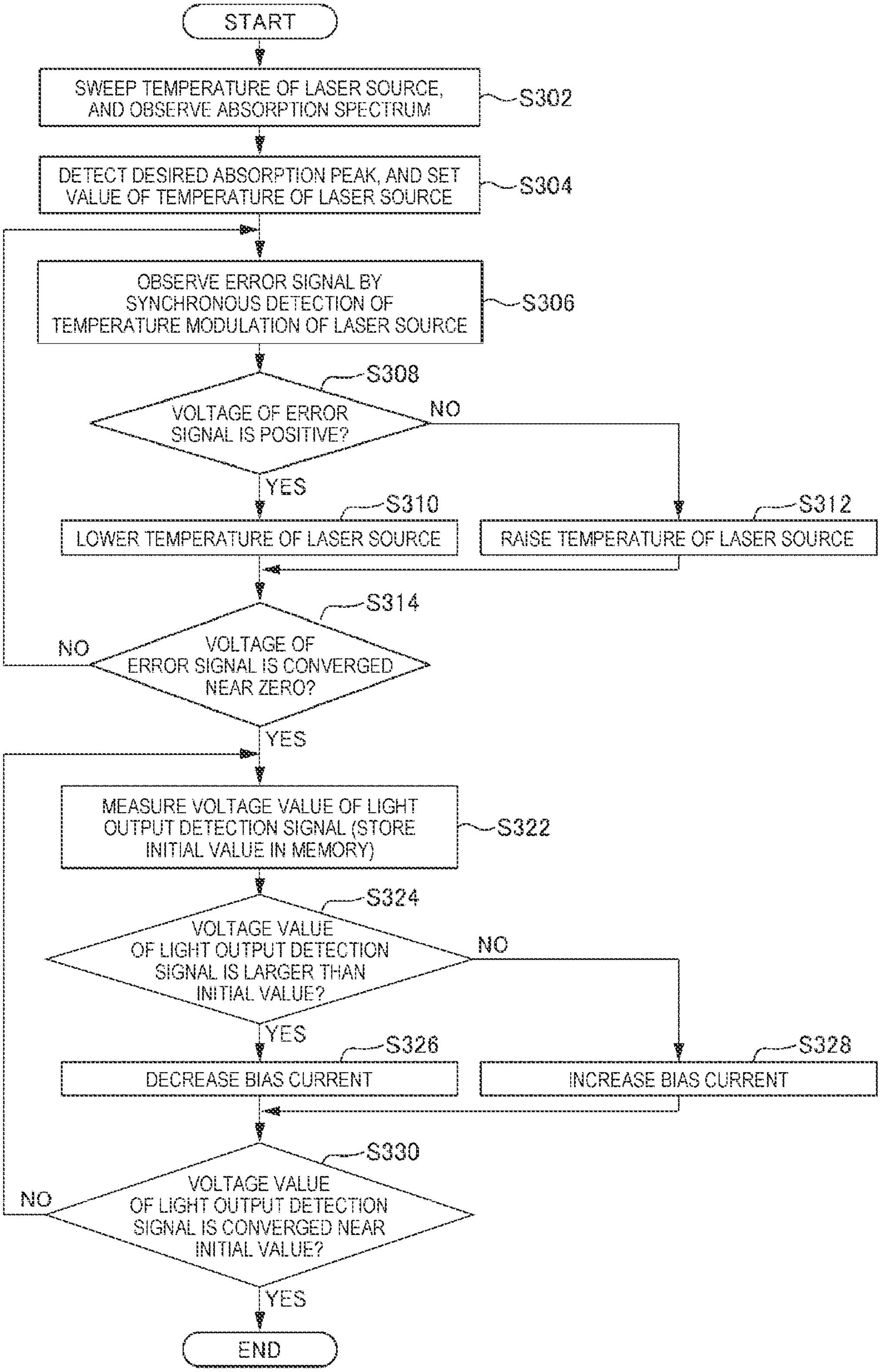
FIG. 12 is a flowchart showing two types of feedback control (feedback control of temperature and bias current).

FIG. 12 is a flowchart showing two types of feedback control described above (feedback control of temperature and bias current).

In step S302 shown in FIG. 12, the temperature of the laser source 2 is swept, and the absorption spectrum is observed.

In step S304, a desired absorption peak is detected, and a value of the temperature of the laser source 2 is set.

In step S306, the error signal is observed by synchronous detection of temperature modulation of the laser source 2.

In step S308, it is determined whether the voltage of the error signal is positive. When the voltage is positive, the process proceeds to step S310. In step S310, the temperature of the laser source 2 is adjusted to decrease. On the other hand, when the voltage is negative, the process proceeds to step S312. In step S312, the temperature of the laser source 2 is adjusted to increase.

In step S314, it is determined whether the voltage of the error signal is converged near zero. When not converged, the process returns to step S306. When converged, the process proceeds to step S322.

In step S322, a voltage value of the light output detection signal SL2, which is a voltage signal output from the light output detector 73, is measured. An initial value of the voltage value is stored in advance in a memory (not shown).

In step S324, it is determined whether the measured voltage value of the light output detection signal SL2 is larger than the initial value. When the measured voltage value is larger than the initial value, the process proceeds to step S326. In step S326, the bias current is adjusted to decrease. On the other hand, when the measured voltage value is smaller than the initial value, the process proceeds to step S328. In step S328, the bias current is adjusted to increase.

In step S330, it is determined whether the voltage value of the light output detection signal SL2 is converged near the initial value. When not converged, the process returns to step S322. When converged, the flow ends.

Then, the above flow is repeated as necessary. Accordingly, both the center wavelength (center frequency) of the emitted light L1 and the light output can be stabilized.

5. Third Modification

Next, a third modification of the laser interferometer 1 will be described.

Figure 13:
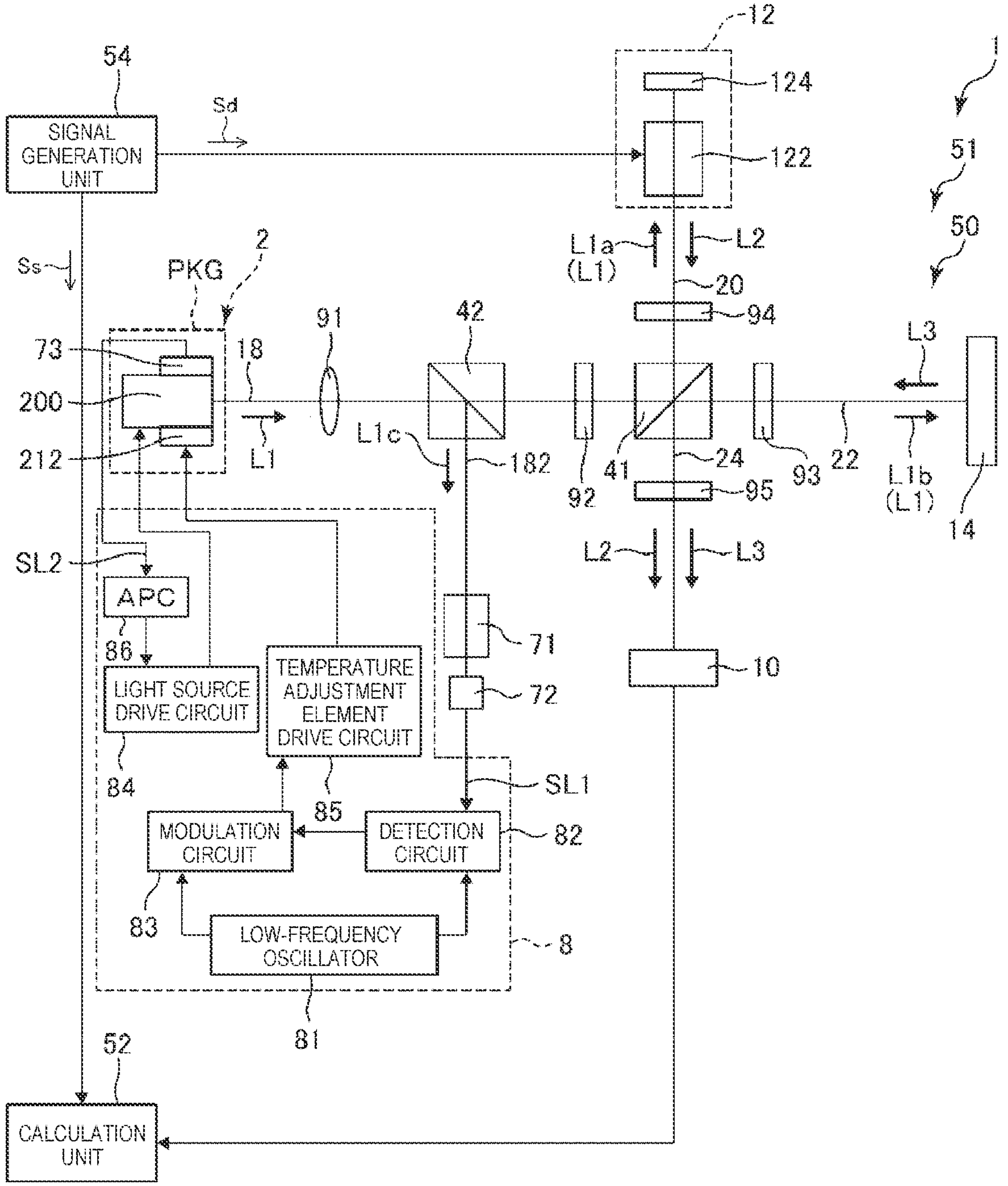
FIG. 13 is a schematic configuration diagram showing a laser interferometer according to a third modification.

FIG. 13 is a schematic configuration diagram showing the laser interferometer 1 according to the third modification.

Hereinafter, the third modification will be described. In the following description, differences from the above embodiment and the modification will be mainly described, and the description of similar matters will be omitted. In FIG. 13, the same reference numerals are given to matters the same as those in the second modification.

The third modification is the same as the second modification except that the light output detector 73 is provided in a package PKG of the laser source 2.

The laser source 2 shown in FIG. 13 includes the light emitter 200 and the package PKG. The light emitter 200 is, for example, the above-described semiconductor laser element. The package PKG is a container that accommodates the light emitter 200.

In FIG. 13, the light output detector 73 is provided in the package PKG. Accordingly, a size of the interference optical system 50 can be further reduced.

In the third modification described above, effects same as those of the second modification can also be obtained.

6. Fourth Modification

Next, a fourth modification of the laser interferometer 1 will be described.

Figure 14:
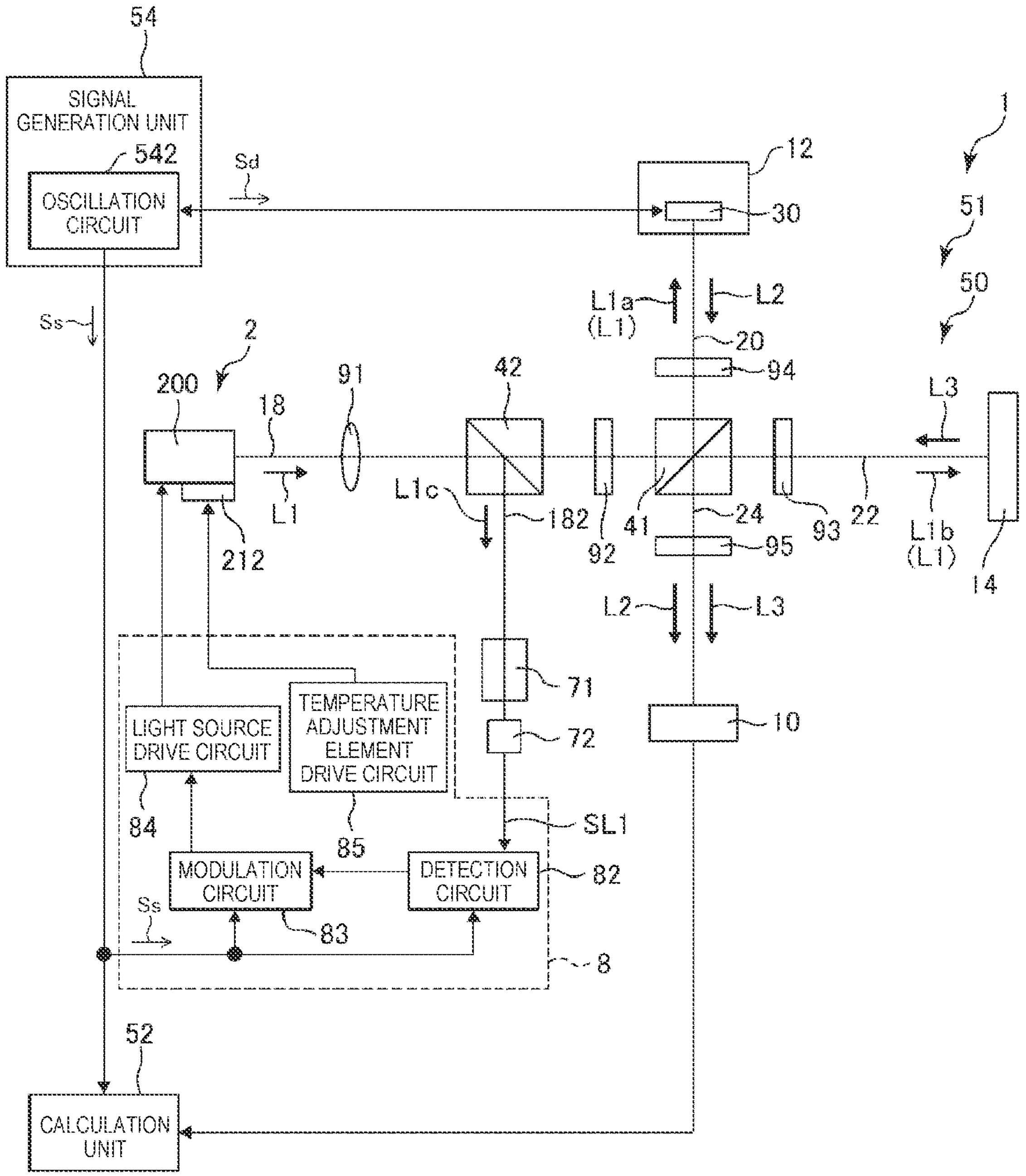
FIG. 14 is a schematic configuration diagram showing a laser interferometer according to a fourth modification.

FIG. 14 is a schematic configuration diagram showing the laser interferometer 1 according to the fourth modification.

Hereinafter, the fourth modification will be described. In the following description, differences from the above embodiment and the modification will be mainly described, and the description of similar matters will be omitted. In FIG. 14, the same reference numerals are given to matters the same as those in the above embodiment.

The fourth modification is the same as the above embodiment except that the configuration of the optical modulator 12 is different and the low-frequency oscillator 81 is omitted.

The optical modulator 12 shown in FIG. 14 includes a vibrator 30. Examples of the vibrator 30 include a quartz crystal vibrator, a silicon vibrator, and a ceramic vibrator. These vibrators are vibrators that utilize a mechanical resonance phenomenon, and therefore have a high Q value and can easily stabilize a natural frequency. Accordingly, the S/N ratio of the modulation signal applied to the emitted light L1 by the optical modulator 12 can be increased, and accuracy of the reference signal Ss can be increased. Accordingly, the sample signal derived from the object 14 can be demodulated with a high S/N ratio, and the laser interferometer 1 capable of measuring the speed and the displacement of the object 14 with higher accuracy can be implemented.

The signal generation unit 54 shown in FIG. 14 includes an oscillation circuit 542. The oscillation circuit 542 operates with the vibrator 30 as a signal source to generate a periodic signal with high accuracy. Accordingly, the oscillation circuit 542 outputs the reference signal Ss while outputting the drive signal Sd with high accuracy. Therefore, the drive signal Sd and the reference signal Ss are influenced in the same way when subjected to a disturbance. As a result, the modulation signal added via the vibrator 30 driven by the drive signal Sd and the reference signal Ss are also influenced in the same way. Therefore, when the light receiving signal including the modulation signal and the reference signal Ss are subjected to calculation in the calculation unit 52, the influence of disturbances contained in both signals can be canceled out or reduced in the process of the calculation. As a result, the calculation unit 52 can accurately obtain the position and the speed of the object 14 even when subjected to the disturbance.

Examples of the vibrator 30 and the oscillation circuit 542 include a vibrator and an oscillation circuit disclosed in JP-A-2022-38156.

In the light source controller 8 shown in FIG. 14, the low-frequency oscillator 81 is omitted. The reference signal Ss generated by the oscillation circuit 542 is used as the low-frequency signal input to each of the detection circuit 82 and the modulation circuit 83. Accordingly, the configuration of the light source controller 8 can be simplified as compared with the above embodiment, and the size of the laser interferometer 1 can be further reduced and a cost can be reduced.

In the fourth modification described above, effects same as those of the above embodiment can also be obtained. In addition, the vibrator 30 has features such as small size, light weight, and low power consumption as compared with the AOM and the EOM. Therefore, according to the fourth modification, it is possible to reduce the size, weight, and power consumption of the laser interferometer 1.

Although the modification is an example in which the low-frequency oscillator 81 is omitted, a signal output from the low-frequency oscillator 81 may be used as in the other modifications, instead of using the reference signal Ss. That is, a configuration example in which the low-frequency oscillator 81 is added to the modification is also one of the modifications.

7. Fifth Modification

Next, a fifth modification of the laser interferometer 1 will be described.

The fifth modification has a configuration obtained by combining the first modification and the fourth modification described above. That is, the fifth modification includes a configuration that enables the feedback control of the temperature of the laser source 2, and the optical modulator 12 including the vibrator 30. Accordingly, it is possible to add effects such as small size, light weight, low cost, and low power consumption to the effects of the first modification.

8. Sixth Modification

Next, a sixth modification of the laser interferometer 1 will be described.

The sixth modification has a configuration obtained by combining the second modification and the fourth modification described above. That is, the sixth modification includes a configuration that enables the two types of feedback control described above, and the optical modulator 12 including the vibrator 30. Accordingly, it is possible to add effects such as small size, light weight, low cost, and low power consumption to the effects of the second modification.

9. Seventh Modification

Next, a seventh modification of the laser interferometer 1 will be described.

The seventh modification has a configuration obtained by combining the third modification and the fourth modification described above. That is, the seventh modification includes a configuration that enables the two types of feedback control described above in a more space-saving manner, and the optical modulator 12 including the vibrator 30. Accordingly, it is possible to add effects such as small size, light weight, low cost, and low power consumption to the effects of the third modification.

10. Effects of Above Embodiment and Modifications

As described above, the laser interferometer 1 according to the above embodiment and the modifications includes the interference optical system 50, the gas cell 71, the detector 72, and the light source controller 8. The interference optical system 50 includes the laser source 2 that emits the emitted light L1, which is the laser beam, and causes the laser beams, for example, the reference light L2 and the object light L3 to interfere with each other. The gas cell 71 seals the gas absorbing light having a predetermined wavelength, and allows the branched light L1*c* (laser beam) to be incident. The detector 72 detects the amount of the light emitted from the gas cell 71, and outputs the emitted light amount detection signal SL1. The light source controller 8 controls the wavelength of the emitted light L1 based on the emitted light amount detection signal SL1.

According to such a configuration, it is possible to adjust driving of the laser source 2 by using gas sealed in the gas cell 71 to absorb the light, so that the center wavelength (center frequency) of the emitted light L1 is constant. Accordingly, it is possible to implement the laser interferometer 1 in which the wavelength of the emitted light L1 is stabilized. In such a laser interferometer 1, for example, the accuracy of measured displacement of the object 14 can be improved.

The light source controller 8 preferably controls the wavelength of the emitted light L1 (laser beam) by adjusting a current (bias current) input to the laser source 2 based on the emitted light amount detection signal SL1.

According to such a configuration, it is possible to implement the laser interferometer 1 having a relatively high response for stabilizing the center wavelength.

In addition, the laser interferometer 1 may include the light emitter 200 and the temperature adjuster 212 that controls the temperature of the light emitter 200. In this case, the light source controller 8 has a function of controlling the wavelength of the emitted light L1 (laser beam) by adjusting the output of the temperature adjuster 212 based on the emitted light amount detection signal SL1.

According to such a configuration, it is possible to reduce the amount of change in the amount of the light when adjusting the wavelength of the emitted light L1. Accordingly, it is possible to prevent a change in the amount of the interference light incident on the light receiving element 10 of the interference optical system 50. As a result, it is possible to prevent variation over time of the S/N ratio of the light receiving signal.

The laser source 2 may include the package PKG that accommodates the light emitter 200. In this case, the temperature adjuster 212 is provided in the package PKG.

According to such a configuration, the size of the interference optical system 50 can be further reduced.

The laser interferometer 1 may further include the light output detector 73. The light output detector 73 detects the light output of the laser source 2 and outputs the light output detection signal SL2. In this case, the light source controller 8 controls the amount of the emitted light L1 (laser beam) by adjusting the current (bias current) input to the laser source 2 based on the light output detection signal SL2.

According to such a configuration, two types of feedback control (feedback control of temperature and bias current) can be performed. Accordingly, the center wavelength (center frequency) of the emitted light L1 emitted from the laser source 2 can be stabilized, and the light output can be controlled to be constant.

The interference optical system 50 may include the vibrator 30 irradiated with the first split light L1*a* (laser beam) and the oscillation circuit 542 that outputs the reference signal Ss using the vibrator 30 as a signal source. In this case, the laser interferometer 1 includes the optical modulator 12 that superimposes the modulation signal on the first split light L1*a*.

According to such a configuration, when the light receiving signal including the modulation signal and the reference signal Ss are subjected to calculation in the calculation unit 52, the influence of disturbances contained in both signals can be canceled out or reduced in the process of the calculation. As a result, the calculation unit 52 can accurately obtain the position and the speed of the object 14 even when subjected to the disturbance. In addition, it is possible to reduce the size, weight, and power consumption of the laser interferometer 1.

The light source controller 8 may operate using the reference signal Ss.

According to such a configuration, the configuration of the light source controller 8 can be simplified, and the size of the laser interferometer 1 can be further reduced and the cost can be reduced.

The laser source 2 is preferably a semiconductor laser element.

Accordingly, a size of the laser source 2 can be particularly reduced. Therefore, a size of the laser interferometer 1 can be reduced.

Although the laser interferometer according to the disclosure has been described above based on the embodiment and the modifications thereof shown in the drawings, the laser interferometer according to the disclosure is not limited to the above embodiment and the modifications thereof, and the configuration with the units can be replaced with any similar configuration. In addition, any other components may be added to the laser interferometers according to the above embodiment and the modifications thereof. Further, two or more of the above embodiment and the modifications thereof may be combined.

The laser interferometer according to the disclosure can be applied to, for example, a vibrometer, a tilt meter, a distance meter (length measuring device), and the like in addition to the displacement meter and the speedometer described above. In addition, examples of applications of the laser interferometer according to the disclosure include: an optical comb interference measurement technique that enables distance measurement, 3D imaging, spectroscopy, and the like; an optical fiber gyro that implements an angular velocity sensor, an angular acceleration sensor, and the like; and a Fourier spectrometer including a moving mirror device.

Two or more of the laser source, the optical modulator, and the light receiving element may be placed on a same substrate. Accordingly, it is possible to easily reduce a size and weight of an optical system, and to improve ease of assembly.

Further, although the above embodiment and the modifications thereof include the so-called Michelson interference optical system, the laser interferometer according to the disclosure can be applied to a laser interferometer having another type of interference optical system, for example, a Mach-Zehnder interference optical system.

Although the interference light of the reference light L2 and the object light L3 is incident on the light receiving element in the above embodiment, any laser beam including the sample signal and the modulation signal may be incident on the light receiving element, and thus, the optical path followed by the laser beam is not limited to the above embodiment. For example, the interference optical system may be formed such that the laser beam emitted from the laser source is incident on the light receiving element sequentially through the optical modulator and the object. In contrast, the interference optical system may be formed such that the laser beam emitted from the laser source is incident on the light receiving element sequentially through the object and the optical modulator.

What is claimed is:

1. A laser interferometer comprising:

an interference optical system including a laser source configured to emit a first emitted light;

a first light splitter configured to split the first emitted light into a branched light and a remaining part of the first emitted light;

an optical modulator;

a second light splitter configured to split the remaining part of the first emitted light into a first split light and a second split light and mix an object light and a reference light, the object light being generated from the second split light incident on an object, the reference light being generated from the first split light incident on the optical modulator;

a gas cell configured to seal a gas that absorbs a light having a predetermined wavelength to allow the branched light to be incident thereon and emit a second emitted light;

a detector configured to detect an amount of the second emitted light and output a second emitted light amount detection signal; and a light source controller configured to control a wavelength of the first emitted light based on the second emitted light amount detection signal and a reference signal.

2. The laser interferometer according to claim 1, wherein the light source controller controls the wavelength of the first emitted light by adjusting a current input to the laser source based on the second emitted light amount detection signal.

3. The laser interferometer according to claim 1, wherein the laser source includes a light emitter and a temperature adjuster configured to adjust a temperature of the light emitter, and the light source controller controls the wavelength of the first emitted light by adjusting an output of the temperature adjuster based on the second emitted light amount detection signal.

4. The laser interferometer according to claim 3, wherein the laser source includes a package accommodating the light emitter, and the temperature adjuster is provided in the package.

5. The laser interferometer according to claim 3, further comprising:

a light output detector configured to detect a light output of the laser source and output a light output detection signal, wherein the light source controller controls an amount of the first emitted light by adjusting a current input to the laser source based on the light output detection signal.

6. The laser interferometer according to claim 1, wherein the interference optical system includes a signal generator configured to output a drive signal and the optical modulator configured to superimpose a modulation signal on the first emitted light, and the modulation signal is controlled by the drive signal.

7. The laser interferometer according to claim 6, wherein the signal generator includes an oscillation circuit, and the interference optical system includes a vibrator configured to be irradiated with the first split light and the oscillation circuit configured to output the reference signal and the drive signal using the vibrator as a signal source.

8. The laser interferometer according to claim 1, wherein the laser source is a semiconductor laser element.

9. A laser interferometer comprising:

an interference optical system including a laser source configured to emit first emitted light;

a first light splitter configured to split the first emitted light into a branched light and a remaining part of the first emitted light;

an optical modulator;

a second light splitter configured to split the remaining part of the first emitted light into a first split light and a second split light and mix the first split light and a third split light, the third split light being generated by the second split light passing sequentially through the optical modulator and an object;

a gas cell configured to seal a gas that absorbs a light having a predetermined wavelength to allow the branched light to be incident thereon and emit a second emitted light;

a detector configured to detect an amount of the second emitted light and output a second emitted light amount detection signal; and a light source controller configured to control a wavelength of the first emitted light based on the second emitted light amount detection signal and a reference signal.

10. A laser interferometer comprising:

an interference optical system including a laser source configured to emit a first emitted light;

a first light splitter configured to split the first emitted light into a branched light and a remaining part of the first emitted light;

an optical modulator;

a second light splitter configured to split the remaining part of the first emitted light into a first split light and a second split light and mix the first split light and a third split light, the third split light being generated by the second split light passing sequentially through an object and the optical modulator;

a gas cell configured to seal a gas that absorbs a light having a predetermined wavelength to allow the branched light to be incident thereon and emit a second emitted light;

a detector configured to detect an amount of the second emitted light and output a second emitted light amount detection signal; and a light source controller configured to control a wavelength of the first emitted light based on the second emitted light amount detection signal and a reference signal.

* * * * *